US006363507B1

(12) United States Patent
Truebenbach et al.

(10) Patent No.: US 6,363,507 B1
(45) Date of Patent: *Mar. 26, 2002

(54) INTEGRATED MULTI-CHANNEL ANALOG TEST INSTRUMENT ARCHITECTURE PROVIDING FLEXIBLE TRIGGERING

(75) Inventors: Eric L. Truebenbach, Sudbury; Jiann-Neng Chen, Weston; Richard P. Davis, Beverly; John J. Arena, Reading; Teresa P. Lopes, Somerville; David J. Lind, Stoughton, all of MA (US)

(73) Assignee: Teradyne, Inc., Boston, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/174,866

(22) Filed: Oct. 19, 1998

(51) Int. Cl.[7] .............................................. G01R 31/28
(52) U.S. Cl. ....................................................... 714/734
(58) Field of Search ................................ 714/734, 724, 714/744, 738; 710/104; 702/124, 189, 190, 120, 117, 119; 327/160, 161, 242, 251, 258, 276, 295; 708/3

(56) References Cited

U.S. PATENT DOCUMENTS

| 4,044,244 A | * | 8/1977 | Foreman et al. ............ 714/724 |
| 4,066,882 A | * | 1/1978 | Esposito .................... 714/724 |
| 4,620,304 A | | 10/1986 | Faran, Jr. et al. ........... 714/734 |
| 4,848,702 A | * | 7/1989 | West et al. ................. 327/160 |
| 5,081,297 A | * | 1/1992 | Lebel et al. ................. 710/104 |
| 5,414,365 A | | 5/1995 | Coggins et al. ............. 324/607 |
| 5,532,944 A | * | 7/1996 | Battista ........................ 708/3 |
| 6,073,259 A | * | 6/2000 | Sartschev et al. ........... 714/724 |
| 6,101,622 A | * | 8/2000 | Lesmeister .................. 714/724 |

FOREIGN PATENT DOCUMENTS

| EP | 0468553 A | 1/1992 | ........... G06F/15/20 |
| EP | 0501963 B | 10/1994 | ........... G01P/3/489 |
| EP | 0710910 A | 5/1996 | ........... G06F/11/32 |

OTHER PUBLICATIONS

Brawn, I. et al. (A flexible demonstrator system for the ATLAS level–1 calorimeter trigger; IEEE, Nov. 9, 1996).*

(List continued on next page.)

*Primary Examiner*—Albert DeCady
*Assistant Examiner*—Guy Lamarre
(74) *Attorney, Agent, or Firm*—Teradyne Legal Dept.

(57) ABSTRACT

Analog test instrument architecture for performing functional testing of electronic circuit assemblies is disclosed. The analog test instrument includes a plurality of identical channels, each channel including circuitry for driving test stimuli and measuring responses at one node of a circuit assembly under test. The driver and measurement circuitry in each channel implement functions that traditionally have been implemented in a test system using discrete instruments. The analog test instrument further includes a master clock reference, which is used for synchronizing the operation of the driver and measurement circuits. Each channel further includes triggering circuitry for distributing trigger events within the channel and to the other channels; and, an input buffer, which is shared by the measurement circuits in the channel. The synchronized operation, distributed trigger events, and shared input buffers are used to improve the correlation of measurements made during functional testing.

25 Claims, 6 Drawing Sheets

OTHER PUBLICATIONS

Tucker, J.L. et al. ( Improving test & measurement system control and throughput using an independent system trigger controller; IEEE, May 1993).*

Hamling, D.T et al. (Automatic bipolar ASIC wafer testing up to 5 GHz; IEEE, Sep. 19, 1989).*

Voss, D.E. et al. (Ultra–wide band, high–repetition rate single channel mobile diagnostic system; IEEE, Jun. 5, 1992).*

Sheehan Et Al(A 7–Channel Level Generator Chip for a VLSI Digital Tester. IEEE, May 1990).*

Jackson Et Al(Universal Pin Electronics Bit Application. IEEE, Oct. 1988).*

Multiple Measurement System, Teradyne, Inc., Approximately 1988.

VXI DMM/Counter Core Instrument Set: The "Hammer and Saw" of Measurement Tools, Tektronix, Inc. Downloaded Jan. 16, 1999 from Tektronix web site at www.tek.com.

HP E1441A Arbitrary Waveform Generator, Hewlett–Packard Test and Measurement, Downloaded Jan. 16, 1999 from Hewlett–Packard web site at www.tmo.hp.com.

Backgrounder—M–Module Standard, Hewlett–Packard Test and Measurement, Downloaded Jul. 15, 1999 from Hewlett–Packard web site at www.tmo.hp.com.

Modular VXI Instruments and various Product Briefs and Specifications, VXI Technology, Inc., Downloaded Jul. 15, 1999 from www.vxitech.com.

* cited by examiner

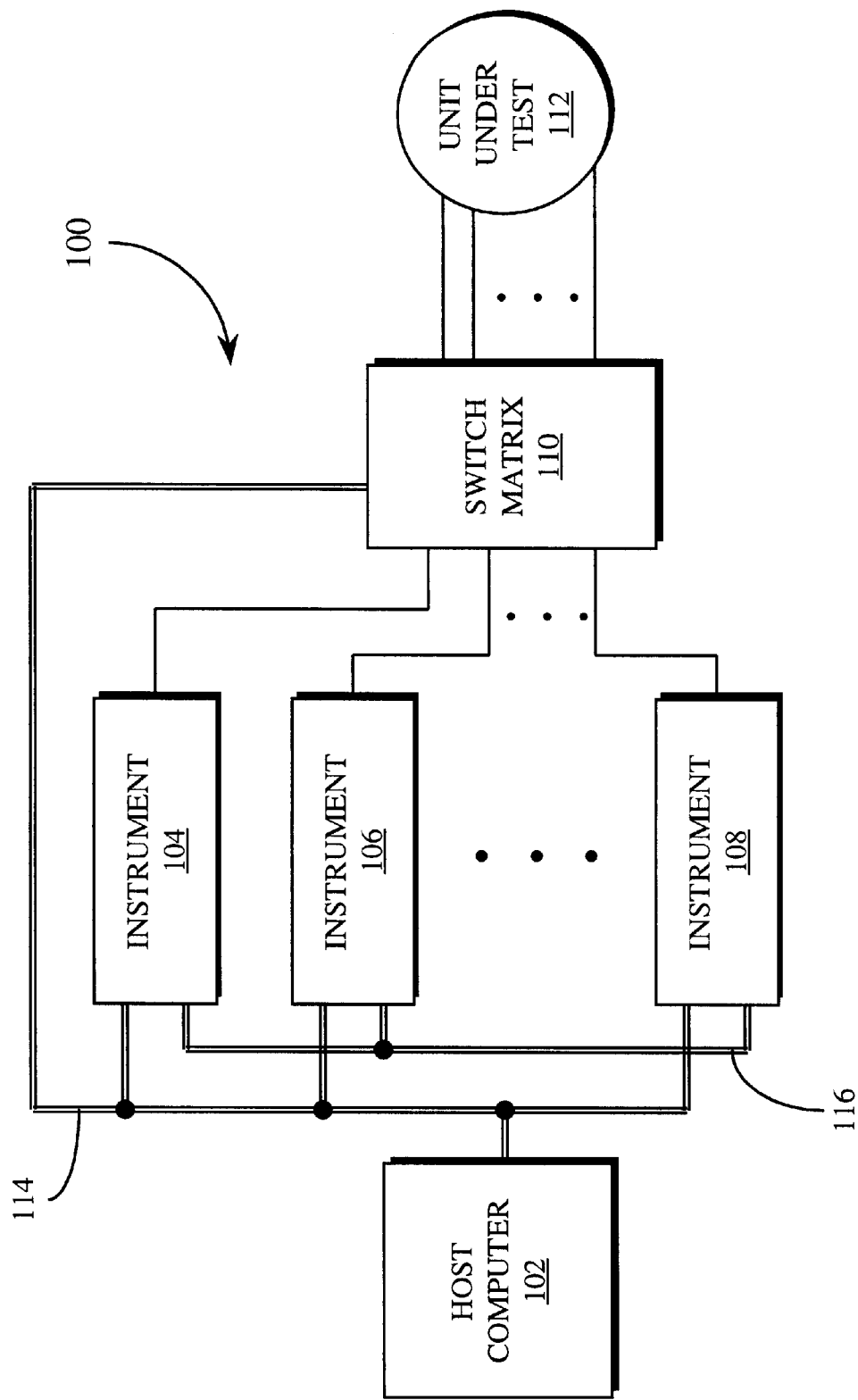
FIG. 1 - PRIOR ART

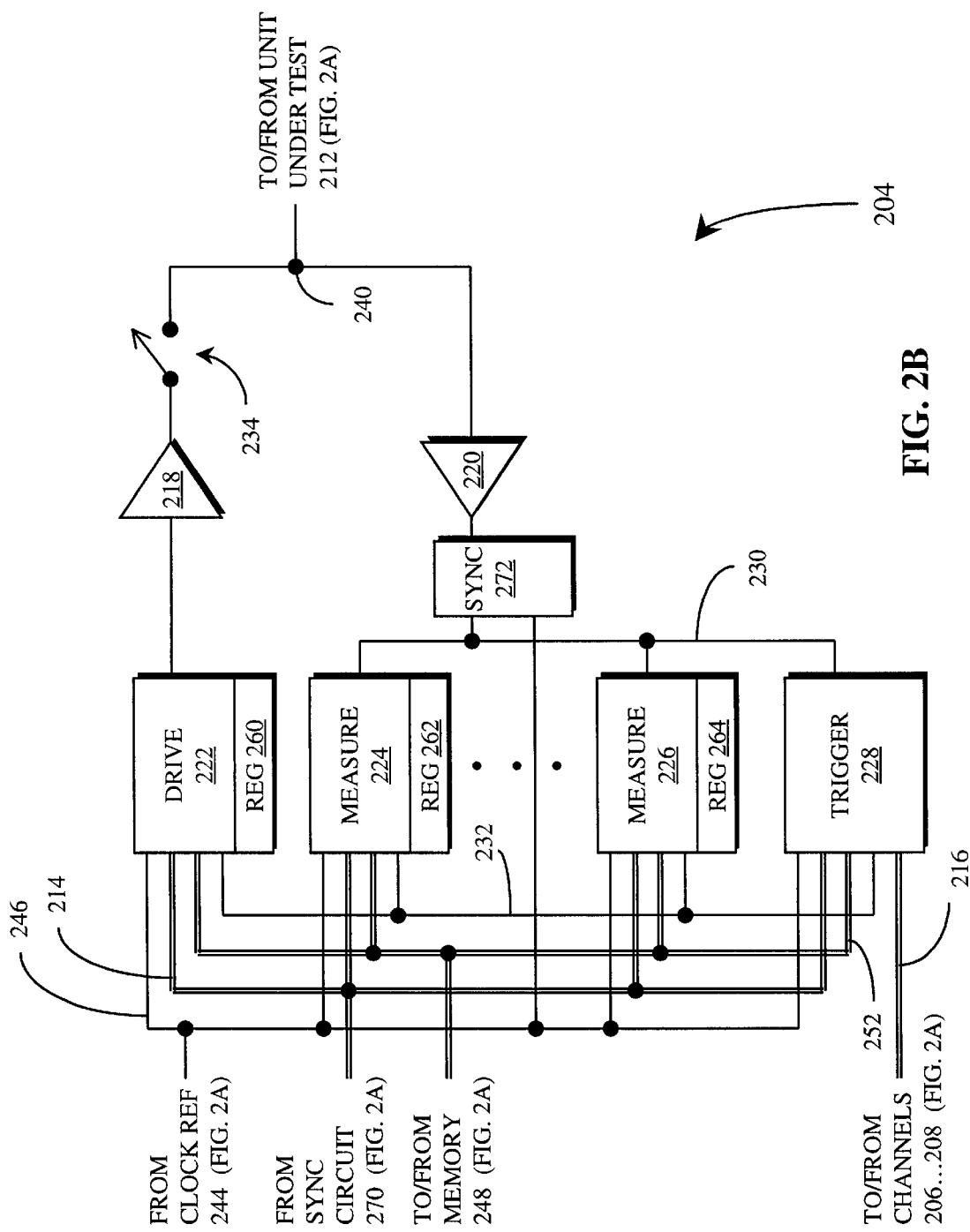

INTEGRATED MULTI-CHANNEL ANALOG TEST INSTRUMENT ARCHITECTURE PROVIDING FLEXIBLE TRIGGERING

This invention relates generally to automatic test equipment, and more specifically to a test instrument architecture for testing analog and mixed-signal electronic circuit assemblies.

Electronic circuit assemblies are typically tested at least once during their manufacture. One type of test is commonly known as functional testing, which is typically used to determine whether a unit under test (UUT) is capable of performing properly in its final operating environment. To this end, functional testing includes applying test stimuli to the UUT, observing responses generated by the UUT, and then determining whether the observed responses are acceptable for a properly functioning UUT.

Functional testing of circuit assemblies that include just analog or both analog and digital (i.e., mixed-signal) circuitry poses particular problems because the applied test stimuli and observed responses for these assemblies normally include many different waveforms and levels. Further, the observed responses must usually be evaluated relative to the test stimuli and sometimes each other. It is therefore often very challenging to generate the test stimuli and evaluate the responses in a way that closely simulates the final operating environments of these circuit assemblies.

Further, because functional testing of circuit assemblies typically occurs in a manufacturing environment, it is important that circuit assemblies are tested quickly and that problems in the assemblies are quickly identified, thereby keeping manufacturing costs down.

FIG. 1 shows conventional test equipment architecture 100 that may be used to perform functional testing of electronic circuit assemblies with analog and/or mixed-signal circuitry. Architecture 100 includes a number of discrete instruments 104, 106, and 108, which apply test stimuli to a UUT 112 and observe responses generated by the UUT 112.

Because the UUT 112 may include analog or mixed-signal circuitry, the instruments 104, 106, and 108 may include both analog and digital instruments. For example, the analog instruments may include a function generator for generating arbitrary waveforms or standard waveforms such as sine waves, triangle waves, or square waves; a multimeter for measuring levels generated by the UUT 112; a waveform digitizer for sampling waveforms generated by the UUT 112 and storing the samples in memory (not shown) for subsequent analysis; or a timer/counter for making frequency, period, and time interval measurements.

In addition, the digital instruments may include devices for driving digital signals and sensing logic states on the UUT 112, and for measuring certain parameters of digital signals produced by the UUT 112. For example, one of the digital instruments may be used to measure logic levels of a digital signal at particular points in time.

The instruments 104, 106, and 108 are controlled by a host computer 102, which communicates with the instruments 104, 106, and 108 via a buss 114. The instruments 104, 106, and 108 are also normally connected to a buss 116, which carries triggering signals between the instruments. In a typical test configuration, the busses 114 and 116 are compatible with a standard interface such as HP-IB (IEEE-488) or VXIbus (IEEE-1155). Accordingly, the host computer 102 can be programmed to synchronize and control the operation of the instruments 104, 106, and 108 by specifying control and triggering signals carried by the busses 114 and 116, respectively.

As mentioned above, functional testing includes applying test stimuli to a UUT and observing responses generated by the UUT. For this reason, typical architecture 100 also includes a switch matrix 110, which is also controlled by the host computer 102 via the buss 114. The switch matrix 110 typically includes relays that are controlled to connect the instruments 104, 106, and 108 to selected nodes of the UUT 112. Nodes selected during functional testing are typically those nodes that are used in the final operating environment of the UUT.

For example, one or more of the instruments 104, 106, and 108 may be connected to nodes of the UUT 112 for applying test signals to the nodes. Further, response signals at other nodes of the UUT 112 may be measured by one or more of the instruments 104, 106, and 108. Accordingly, the host computer 102 may be programmed to actuate the relays in the switch matrix 110, thereby making necessary connections between the instruments 104, 106, and 108 and the nodes of the UUT 112 during a test session.

An example of architecture 100, in which both analog and digital instruments are connected to a UUT via a switch matrix, is illustrated in U.S. Pat. No. 4,070,565 assigned to TERADYNE®, Inc., Walnut Creek, Calif., USA. Another example of test equipment architecture, in which driver instruments are connected directly to a UUT while measurement instruments are connected to the UUT through a switch matrix, is illustrated in U.S. Pat. No. 4,216,539, which is also assigned to TERADYNE®, Inc.

Although test equipment architecture 100 has been used to perform functional testing of electronic circuit assemblies, we have recognized several shortcomings. For example, it was mentioned above that functional testing is typically used to determine whether a UUT can perform properly in its final operating environment. This generally means that architecture 100 must simulate the operating environment of the UUT as closely as possible and accurately evaluate the performance of the UUT in this simulated environment. However, conventional architecture 100 is based upon a collection of discrete instruments 104, 106, and 108, which frequently cannot simulate the operating environment as desired.

For example, if multiple measurements were needed to evaluate a signal at a node of a UUT, then the host computer 102 might control the switch matrix 110 to connect multiple measurement instruments to that node. However, this might subject the node to an unwanted loading condition that would generally not occur during normal operation.

Even if connecting multiple measurement instruments to a node did not result in an unwanted loading condition, the accuracy of the measurements may still be affected. In particular, different measurement instruments may have different input configurations, each with its own inherent delay characteristics. These delays may be unknown and variable and may even add up across conventional architecture 100, thereby further decreasing the accuracy of measurements.

Instead of connecting multiple measurement instruments to a single node, the host computer 102 may alternatively control the switch matrix 110 to connect the measurement instruments to a node in a sequential manner. Although this approach would probably avoid an unwanted loading condition, it would generally require that multiple measurements at a node be made at different times. This would preclude simultaneous measurements at the node and make it very difficult to analyze one measurement relative to another with any level of accuracy or repeatability.

Another shortcoming of conventional architecture 100 is that it is generally asynchronous. Again, this is because architecture 100 is built around a collection of discrete instruments 104, 106, and 108. Although the instruments 104, 106, and 108 are connected to the triggering buss 116 and can therefore be made to respond to the same triggering events, the instruments 104, 106, and 108 do not typically operate in conjunction with the same clock reference. This makes it very difficult to predict when the instruments will actually respond to the triggering events. Consequently, it may be difficult to achieve good correlation between measurements made by different instruments.

Still another shortcoming of having an architecture based upon a collection of discrete instruments 104, 106, and 108 is that there is frequently a duplication of functions, thereby increasing costs and space requirements. For example, each of the different instruments 104, 106, and 108 typically has its own input section providing signal conditioning, circuit protection, and ranging functions. However, this duplication of functions often becomes apparent especially when using the instruments 104, 106, and 108 to make measurements at a single node of the UUT.

Yet another shortcoming is that custom cabling is usually required between the test equipment 100 and a UUT. Significant costs are generally associated with any custom hardware. Further, the switch matrix 110 is typically implemented with relays, which are not only costly but also frequently unreliable.

It would therefore be desirable to have test instrument architecture that can closely simulate final operating environments of analog and mixed-signal electronic circuit assemblies and accurately evaluate their performance in these simulated environments. Such test instrument architecture would be useful for performing functional testing of the circuit assemblies during their manufacture. It would also be highly desirable to have an analog test instrument that provides better correlation between multiple test measurements.

SUMMARY OF THE INVENTION

With the foregoing background in mind, it is an object of the invention to provide a test instrument that can perform testing of analog and mixed-signal electronic circuit assemblies with higher degrees of accuracy and repeatability.

Another object of the invention is to provide an analog test instrument that can achieve better correlation between test measurements.

Still another object of the invention is to provide an analog test instrument that is less costly and more reliable.

The foregoing and other objects are achieved in an analog test instrument having a plurality of channels, each channel being coupled to a node of a unit under test, and each channel including a plurality of driver and measurement circuits. In a preferred embodiment, each channel includes driver circuitry coupled to an output buffer for driving test stimuli at a node of the unit under test, and each channel includes a plurality of measurement circuits coupled to a shared input buffer for measuring parameters of signals provided at the node of the unit under test.

According to one feature, each channel further includes triggering circuitry coupled to the driver and measurement circuits for providing shared timing events to the driver and measurement circuits and the plurality of channels.

In another embodiment, the analog test instrument includes a master clock reference coupled to each channel for synchronizing the inputs, outputs, and internal operation of the channels.

In another embodiment, test stimuli are applied to a portion of the nodes of an analog circuit and responses, generated by the analog circuit, are measured on another portion of the nodes. Further, the responses are sampled by a digitizer in each of the channels. The sampled responses are then stored in a memory included in the analog test instrument. When one of the response measurements indicates that a test has failed, the stored samples are analyzed for determining a cause of the failure.

In another embodiment, trigger events are periodically applied to driver and measurement circuits in each channel by the triggering circuitry in one of the channels. Test stimuli are then automatically applied and responses are automatically observed at nodes of an analog circuit under test. The test stimuli are applied and the responses are observed at times corresponding to the periodic trigger events. Next, the observed responses are evaluated, thereby determining whether the analog circuit under test is functioning properly.

Still further objects and advantages will become apparent from a consideration of the ensuing description and drawings.

BRIEF DESCRIPTION OF THE DRAWINGS

The invention will be better understood by reference to the following more detailed description and accompanying drawings in which FIG. 1 is a block diagram of conventional test system architecture;

FIG. 2B is a block diagram of channel architecture included in the test instrument architecture shown in FIG. 2A;

DESCRIPTION OF THE PREFERRED EMBODIMENT

Figure 2A:
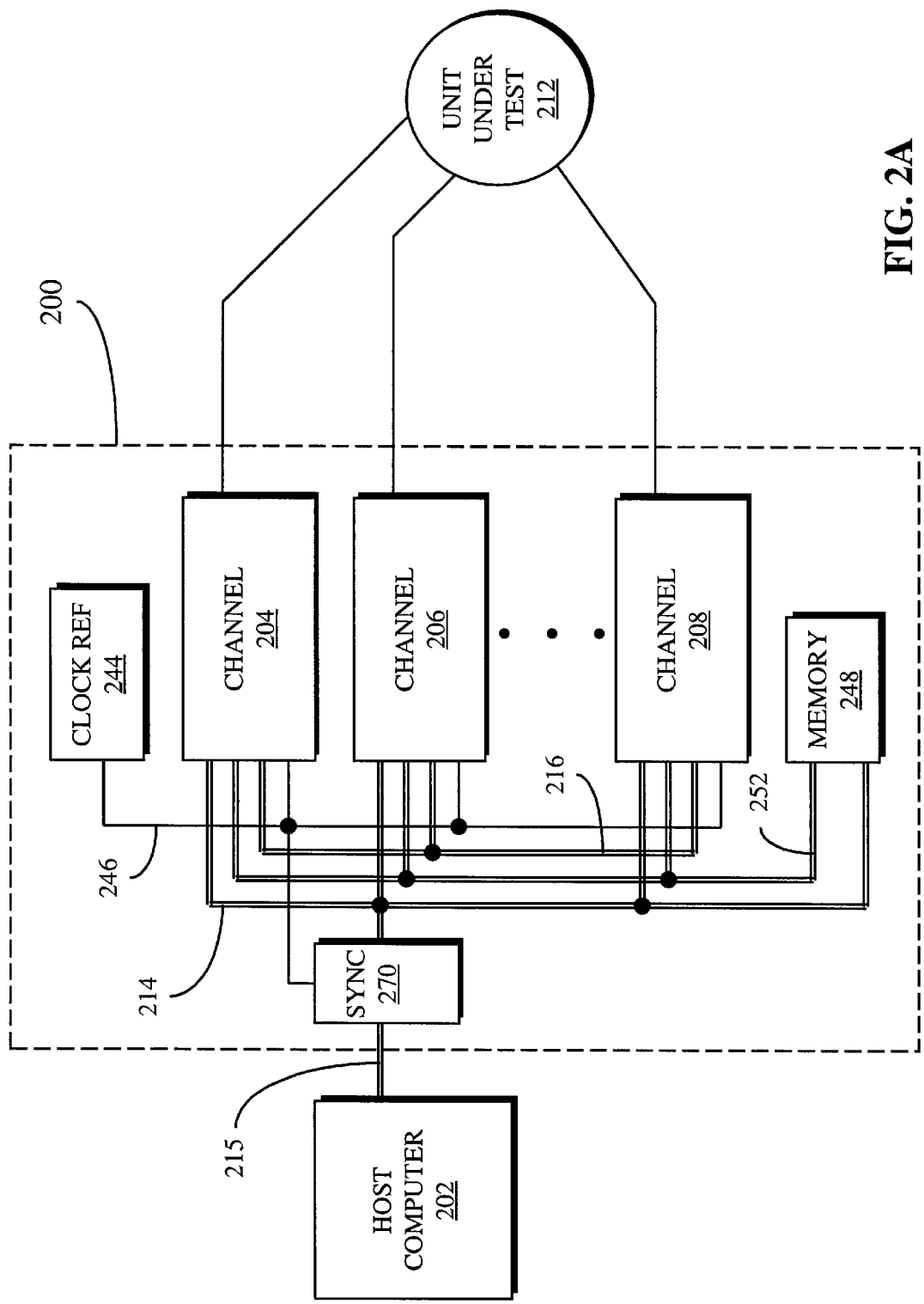
FIG. 2A is an overall block diagram of test instrument architecture in accordance with the invention.

FIG. 2A shows overall architecture 200 for an analog test instrument according to the invention. The analog test instrument is primarily meant to be used for performing functional testing on electronic circuit assemblies including analog and/or mixed-signal circuitry.

Architecture 200 includes a plurality of channels 204, 206, and 208, which are connected to respective nodes of a unit under test (UUT) 212. Because an analog test instrument with architecture 200 is primarily used to perform functional testing, the respective nodes of the UUT 212 are external nodes, which are used during normal operation of the UUT 212. However, it should be understood that the channels 204, 206, and 208 might also be connected to respective internal nodes of the UUT 212.

In the preferred embodiment, the channels 204, 206, and 208 are identical. Accordingly, each channel preferably includes the same circuitry for driving and/or measuring signals and levels at one external node of the UUT 212.

The channels 204, 206, and 208, and a shared memory 248 are coupled to a host computer 202 through a synchronization circuit 270 via busses 214 and 215. The host computer 202 may be an INTEL®-based personal computer with a WINDOWS 95™ operating system. INTEL® is a registered trademark of Intel Corporation, Santa Clara, Calif., USA; and, WINDOWS 95™ is a trademark of Microsoft Corporation, Redmond, Wash., USA. The host computer 202 is therefore a general-purpose computer that can be programmed to perform various operations such as operator interface functions, mathematical computations, and test functions.

Further, the channels 204, 206, and 208, and the shared memory 248 communicate with the host computer 202 via the busses 214 and 215 in a conventional manner. For example, the buss 215 may be compatible with a standard interface such as HP-IB (IEEE-488) or VXIbus (IEEE-1155).

The channels 204, 206, and 208, and the synchronization circuit 270 are also coupled to a master clock reference 244 via a line 246. Further, the timing of the circuitry in the channels 204, 206, and 208, and the synchronization circuit 270 is preferably based upon the same clock reference 244. In this way, the channels 204, 206, and 208 can be made to operate synchronously, and control signals produced by the host computer 202 can be synchronized with the channels 204, 206, and 208.

In addition, the channels 204, 206, and 208 are connected to a buss 216, which distributes triggering signals between the channels. The buss 216 also contributes to the synchronous operation of the channels 204, 206, and 208 as will be described later in this specification.

Finally, the channels 204, 206, and 208 are connected to the shared memory 248 via a buss 252. Any one of the channels 204, 206, and 208 may write or read data to/from the shared memory 248, which is useful for implementing some novel features of the analog test instrument.

FIG. 2B shows architecture of the channel 204. As mentioned above, the channels 204, 206, and 208 are preferably identical and therefore share the same architecture.

The channel 204 includes driver circuitry 222 and a plurality of measurement circuits such as measurement circuits 224 and 226. Each of the driver circuitry 222 and the measurement circuits 224 and 226 include conventional means (not shown) for responding to control signals provided by the host computer 202 on the buss 214. Because various embodiments of the control means are known to those skilled in this art, it should be understood that the particular implementation of the control means is not critical to this invention.

The driver circuitry 222 and the measurement circuits 224 and 226 also preferably include multi-bit registers 260, 262, and 264 (FIG. 2B), which the host computer 202 can query to determine status information such as whether a driving or measuring function has started; whether the circuits 222, 224, and 226 are waiting for a trigger signal; whether the circuits 222, 224, and 226 are currently in the process of driving or measuring; and, whether the driving or measuring function has completed. These registers 260, 262, and 264 are also useful for implementing novel features of the analog test instrument.

Figure 3:
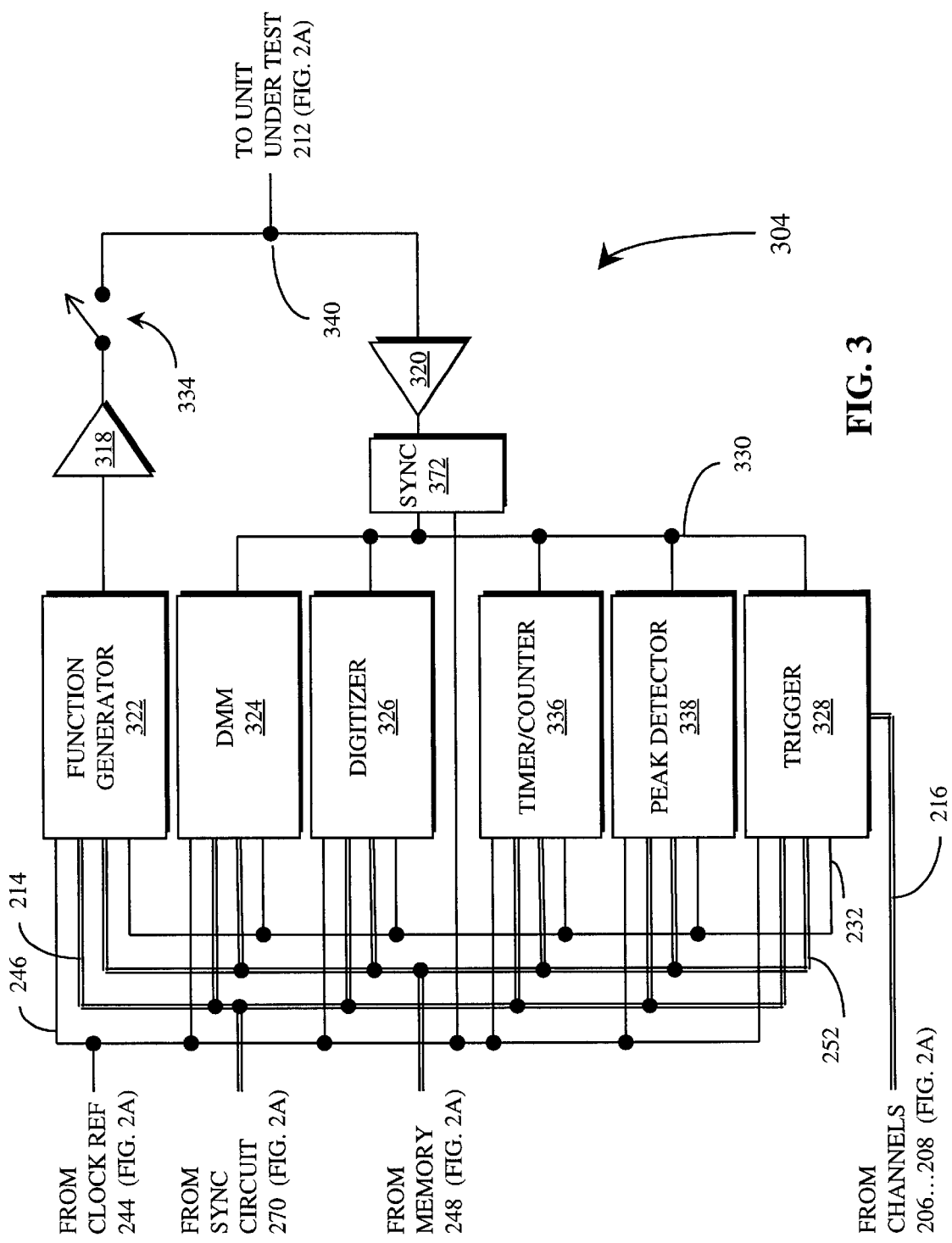
FIG. 3 is an illustrative example of a channel based on the channel architecture shown in FIG. 2B.

Further, the driver circuitry 222 and the measurement circuits 224 and 226 preferably implement functions that are normally provided by discrete instruments in traditional test equipment architecture. For example, FIG. 3 shows a function generator 322, which is meant to illustrate one embodiment of the driver circuitry 222. Under control of the host computer 202, the function generator 322 preferably generates either standard or arbitrary waveforms and levels that are useful for performing functional testing of the UUT 212. For example, the function generator 322 may be controlled to provide standard sine, triangle, or square waves; and, DC voltage and current levels.

FIG. 3 also shows a digital multi-meter (DMM) 324, a digitizer 326, a timer/counter 336, and a peak detector 338. These electronic apparatuses are meant to illustrate embodiments of the plurality of measurement circuits shown in FIG. 2B. For example, the DMM 324 might be controlled to measure either a voltage or a current level at a node of the UUT 212; the digitizer 326 might be controlled to sample a waveform at the node and store the samples in a memory such as the shared memory 248; the timer/counter 336 might be controlled to perform frequency, period, and time interval measurements at the node; and, the peak detector 338 might be controlled to measure peak voltages at the node of the UUT 212.

The function generator 322, the DMM 324, the digitizer 326, the timer/counter 336, and the peak detector 338 implement functions that are known to those skilled in this art. The specific implementations of these apparatuses are therefore not critical to the invention.

As shown in FIG. 2B, the channel 204 further includes triggering circuitry 228, which also includes conventional means (not shown) for responding to control signals provided by the host computer 202. The triggering circuitry 228 provides features that may be found in traditional test equipment such as delayed triggering, event triggering, and edge triggering.

Moreover, the signals provided by the triggering circuitry 228 are shared by the driver and measurement circuits 222, 224, and 226 via a line 232. The host computer 202 can therefore query the status registers 260, 262, and 264 in the circuits 222, 224, and 226 to determine whether the circuits are waiting for a trigger from the triggering circuitry 228. In the illustrative embodiment shown in FIG. 3, the signals provided by the triggering circuitry 328 are similarly shared by the function generator 322, the DMM 324, the digitizer 326, the timer/counter 336, and the peak detector 338.

Not only are the signals produced by the triggering circuitry 228 shared by the driver and measurement circuits in each channel, but they can also be distributed to other channels via the triggering buss 216. For example, FIG. 2A shows that each of the channels 204, 206, and 208 have access to the triggering buss 216.

As mentioned above, each of the channels 204, 206, and 208 in the architecture 200 are preferably identical. Each of the channels 204, 206, and 208 therefore include identical triggering circuitry, which can distribute and receive triggering signals to/from the other channels via the buss 216.

Because the triggering circuitry 228 implements functions that are known to those skilled in this art, the specific implementation of the triggering circuitry 228 is also not critical to the invention. However, important advantages are derived from sharing the triggering circuitry 228 among the driver and measurement circuits in each channel and from distributing triggering signals to the other channels.

For example, the host computer 202 might program the triggering circuitry 328 to issue a "stop" trigger a specified amount of time after detecting a waveform. The host computer 202 might also program the function generator 322 to start producing the waveform on a "start" trigger and to stop producing the waveform on the "stop" trigger. The host computer 202 might then close a discrete relay 334 and control the triggering circuitry 328 to produce the "start" trigger. The function generator 322 then starts producing the waveform, which is detected by the triggering circuitry 328 on the line 330. The triggering circuitry 328 then starts counting the specified amount of time. When the specified amount of time elapses, the triggering circuitry 328 issues the "stop" trigger, thereby causing the function generator 322 to stop producing the waveform. Because each channel is coupled to the control buss 214 and the triggering buss 216, the host computer 202 might similarly control and monitor function generators and triggering circuits located in the same or different channels.

As also mentioned above, each of the channels 204, 206, and 208 preferably drive and/or measure signals and levels at one node of the UUT 212. For this reason, each channel 204, 206, and 208 includes an output buffer 218 and an input buffer 220. Further, as shown in FIG. 2B, each channel 204, 206, and 208 preferably includes a discrete relay 234, which selectively connects or disconnects the output of the buffer 218 from the node of the UUT 212 and the input buffer 220. The discrete relay 234 also includes conventional means (not shown) for responding to control signals provided by the host computer 202.

For example, when the relay 234 is closed, the output buffer 218 can drive test stimuli generated by the driver circuitry 222 to a node of the UUT 212. Similarly, the output buffer 318 shown in FIG. 3 can drive waveforms generated by the function generator 322 to a node of the UUT 212 when the relay 334 is closed.

Further, the input buffer 220 can observe the driven test stimuli and provide them to the measurement circuits 224, 226, and the triggering circuitry 228 on a line 230. Similarly, the input buffer 320 (FIG. 3) can observe driven test stimuli and provide them to the DMM 324, the digitizer 326, the timer/counter 336, the peak detector 338, and the triggering circuitry 328 on a line 330. In this way, for example, parameters related to the test stimuli can be measured by the measurement circuits; and, triggering signals can be produced by the triggering circuitry at times dictated by the test stimuli.

In addition, when the relay 234 is open, the input buffer 220 can observe response signals at a node of the UUT 212 and provide them to the measurement circuits 224 and 226 and triggering circuitry on the line 230. Similarly, the input buffer 320 can observe response signals at a node of the UUT 212 and provide them to DMM 324, the digitizer 326, the timer/counter 336, the peak detector 338, and the triggering circuitry 328 when the relay 334 is open. In this way, for example, parameters related to the response signals can be measured by the measurement circuits; and, triggering signals can be produced by the triggering circuitry at times dictated by the response signals.

In addition, when the relay 234 is closed and the channel 204 is connected to a node of the UUT 212, the input buffer 220 can observe a combination of the test stimuli and the responses generated by the UUT 212. Similarly, the input buffer 320 can observe a combination of test stimuli and responses generated by the UUT 212 when the relay 334 is closed. Additional circuitry (not shown) is generally required for properly combining the test stimuli and responses.

In particular, a current-sensing resistor (not shown) might be connected between the node 340 (FIG. 3) and the UUT 212. The relay 334 might then be closed and the current-sensing resistor used for measuring the current output of the output buffer 318 or for converting voltages provided by the output buffer 318 to current values. Because each of the channels 204, 206, and 208 preferably drive and/or measure signals and levels at one node of the UUT 212, the relay 334 might then be opened and this same resistor used for reducing impedance mismatches between the input buffer 320 and the UUT 212.

The signals and levels that are observed by the input buffers 220 and 320 may cover a wide range of analog levels. For this reason, the input buffers 220 and 320 preferably include circuitry (not shown) for facilitating the measurement of a wide range of analog levels. Such circuitry is illustrated in U.S. patent application Ser. No. 09/104,099, filed Jun. 24, 1998 and assigned to TERADYNE®, Inc., which is fully incorporated herein by reference. That application describes circuitry that can sense a wide range of analog voltage and current levels while satisfying the loading requirements of a unit under test.

An important feature of the invention is that the input buffer 220 is shared among a plurality of measurement circuits and the triggering circuitry. For example, sharing the input buffer 220 between the measurement circuits 224 and 226 and the triggering circuitry 228 saves space that would otherwise be required for respective input buffers coupled to the circuits 224, 226, and 228.

Further, it is expected that having the measurement circuits 224 and 226 coupled to the input buffer 220 via the line 230 will aid a test engineer in achieving absolute correlation between measurements made by the circuits 224 and 226. This is because the test engineer will be able to make measurements essentially simultaneously with the circuits 224 and 226. For example, the test engineer would be able to make measurements with the DMM 324 (FIG. 3) and the timer/counter 336 (FIG. 3) simultaneously.

Achieving absolute correlation between measurements is important when performing functional testing of an electronic circuit assembly because it allows more than one parameter of a signal at a node of the assembly to be accurately measured at the same time. Further, it allows the parameters to be measured at precisely specified times. This means that parameters of signals produced by an assembly under test can be measured and subsequently evaluated as they would appear in the final operating environment of the assembly. Such correlation between measurements is virtually impossible to achieve with traditional analog test equipment that includes a collection of different instruments.

Another important feature of the invention is that architecture 200 (FIG. 2A) preferably includes a plurality of identical channels, each channel including circuitry for processing signals and levels for one node of an electronic circuit assembly under test. It is expected that having a plurality of identical channels in an analog test instrument will also aid the test engineer in achieving absolute correlation between measurements. This is because the identical channels preferably have the same input configurations with the same inherent propagation delays. As mentioned above, traditional analog test equipment generally includes a collection of different instruments, each with different input configurations resulting in delays that are frequently unknown and variable.

Other advantages derived from the plurality of identical channels are that each channel has the same connection to the busses 214 and 216 and the line 246. In particular, the busses 214 and 216 and the line 246 may be part of a standard VXIbus. For example, the buss 216 may include VXIbus trigger lines and the line 246 may carry a VXIbus clock. Further, each channel provides the same interface to the assembly under test. Custom cabling between respective channels and the assembly under test is therefore eliminated.

As mentioned above, the timing of the circuitry in the channels 204, 206, and 208 is preferably based upon the master clock reference 244. It is expected that this will further aid the test engineer in achieving absolute correlation between measurements.

In particular, each of the channels 204, 206, and 208 shown in FIG. 2A is connected to the master clock reference 244 via the line 246. The driver and measurement circuitry and the triggering circuitry in the channels 204, 206, and 208 are therefore preferably configured to operate synchronously. Although such synchronous operation is commonly found in traditional digital systems, it has not previously been extensively utilized in analog test instruments.

In contrast, the host computer 202 and the UUT 212 generally have their own respective clock references and therefore operate asynchronously relative to the analog test instrument and each other.

Nevertheless, all of the signals that are applied to the channels 204, 206, and 208 and all of the signals that are generated by the channels 204, 206, and 208 are preferably synchronized with the master clock reference 244. This includes the control signals that are generated by the host computer 202 on the buss 214 and the signals that are applied to or received from the UUT 212. Such synchronization is achieved in a conventional manner by synchronization circuits 270 and 272 (FIG. 2B), which may include conventional sampling circuitry and flip-flops (not shown).

In particular, the driver circuitry, the measurement circuits, and the triggering circuitry in each channel are coupled to the master clock reference 244 for synchronizing their internal operations with the clock reference 244. Further, the synchronization circuit 270 is coupled to the master clock reference 244 for synchronizing control signals and data passing between the host computer 202 and the channels 204, 206, and 208, and the shared memory 248 with the clock reference 244 (FIG. 2A).

In addition, the synchronization circuit 272 is coupled to the master clock reference 244 and between the input buffer 220 and the measurement circuits 224 and 226 and the triggering circuitry 228 for synchronizing signals passing from the input buffer 220 to the measurement circuits 224 and 226 and the triggering circuitry 228 (FIG. 2B). Corresponding synchronization circuits are included in the identical channels 206 and 208. The function generator 322, the DMM 324, the digitizer 326, the timer/counter 336, the peak detector 338, and the triggering circuitry 328 (FIG. 3) are similarly coupled to the master clock reference 244 and a synchronization circuit 372 for synchronizing their I/O and internal operations with the clock reference 244.

This further aids the test engineer in achieving absolute correlation between measurements because it allows the precise determination of when measurements are to be made using a single channel or a plurality of channels.

Other advantages derived from the synchronous design of architecture 200 include the ability to time-multiplex the storing and retrieving of data to and from the shared memory 248. For example, the host computer 202 might be programmed for controlling the digitizer circuits in the channels 204, 206, and 208 to sample signals produced by the UUT 212 and store sampled data in the shared memory 248 at precisely specified times. Because the channels 204, 206, and 208 sample data synchronously, the data is ensured to be stable when it is written into the shared memory 248. Similarly, the host computer 202 might control the function generators in the channels 204, 206, and 208 to retrieve data from the shared memory 248 at precisely specified times.

In addition, triggering signals are distributed synchronously between the channels 204, 206, and 208. For example, the host computer 202 might control the triggering circuitry 228 in the channel 204 to detect a triggering event and then send this triggering event to the channels 206 and 208 using the buss 216. Because of the synchronous design of architecture 200, the channels 206 and 208 can be controlled to respond to the triggering event at the same time. Responses to triggering events distributed between the channels 204, 206, and 208 are therefore predictable and stable.

In addition, because of the synchronous design of architecture 200, the host computer 202 can control the function generators in the channels 204, 206, and 208 to produce waveforms that are phase synchronous. This means that the waveforms are harmonically related to the frequency provided by the master clock reference 244. Consequently, phase drift is not expected to occur between the waveforms. This further contributes to predictable and stable operation of the analog test instrument.

As mentioned above, the synchronous design of architecture 200 will aid the test engineer in achieving absolute correlation between measurements. For example, the host computer 202 might control the triggering circuitry 328 (FIG. 3) to produce triggers that coincide with rising and falling edges of a pulse provided at a node of the UUT 212, and place these triggering signals on both the internal line 232 and the buss 216. The timer/counter 336 might then be controlled to measure the width of the pulse using the triggers on the line 232.

Further, a timer/counter in another channel might be controlled to measure the period of the waveform using the triggers on the buss 216. Using the measured pulse width and period, the host computer 202 might then be programmed to calculate the duty cycle of the pulse. Because the width and period of the digital pulse are measured at the same time using the same triggering signals, there is absolute correlation between the two measurements. It is expected that making measurements in this way will lead to greater accuracy and repeatability as compared with prior techniques.

In addition, because all of the waveforms generated by the function generators in the channels 204, 206, and 208 are synchronized with the master clock reference 244, and because the control signals from the host computer 202 are also synchronized with the master clock reference 244 by the synchronization circuit 270, the host computer 202 can control the waveform characteristics in a stable and predictable way. For example, the host computer 202 might control the function generator 322 (FIG. 3) to produce a sine wave with a given peak voltage amplitude. The host computer 202 might then control the function generator 322 to change the peak voltage amplitude of the sine wave. Because the control of the sine wave voltage amplitude is synchronous with the master clock reference 244, and because the instruction from the host computer 202 to change the voltage amplitude is also synchronous with the master clock reference 244, the amplitude of the sine wave can be updated smoothly, thereby ensuring that the state of the output is always known.

In addition, because of the synchronous design of architecture 200, the functions 322, 324, 326, 328, 336, and/or 338 (FIG. 3) may be implemented using digital circuitry. As mentioned above, one object of the invention is to provide an analog test instrument that is less costly. Digital circuitry is often cheaper than its equivalent analog circuitry, so one way to decrease the cost of an analog test instrument is to use digital circuitry wherever possible.

For example, the triggering circuitry in each of the channels 204, 206, and 208 preferably performs frequency filtering on its inputs. Because the triggering circuitry synchronizes its inputs with the master clock reference 244, such frequency filtering may be performed using a digital counter (not shown) that might be economically implemented on a standard gate array.

As mentioned above, the busses 214 and 216 and the line 246 may be part of a standard VXIbus. In this case, the master clock reference 244 of the analog test instrument may include conventional circuitry (not shown) for locking to the phase of the VXIbus clock, which is generally a phase-accurate clock on the VXI backplane.

Further, multiple analog test instruments might be plugged into the backplane with their respective master clock references derived from the VXIbus clock in the same way. Because the timing of the channels in the analog test instruments is synchronous with their respective master clock references, which are in turn derived from the same VXIbus clock, the inputs, outputs, and triggering signals across the multiple analog test instruments are synchronous. The outputs across all of the analog test instruments are also in-phase. Accordingly, all of the advantages of derived from the synchronous design of architecture 200 also apply to multiple analog test instruments plugged into a VXI backplane.

As mentioned above, important features of the invention include the synchronous design of the architecture 200; the shared memory 248; the identical channels 204, 206, and 208; and, the shared triggering circuitry in each of the channels 204, 206, and 208. These features can be used to implement new testing methods such as the test method illustrated in FIG. 4. This test method is meant to be performed under control of software programmed into the host computer 202.

First, the host computer 202 programs digitizers in respective channels in block 400 to acquire data samples whenever source or measurement functions in the respective channels are started. For example, the digitizers may be those included in the channels 204 and 206 (FIG. 2A). Further, the digitizers may be programmed to acquire data samples that might appear on respective lines 230 (FIG. 2B). The digitizers are also preferably programmed to store these samples in selected regions of the shared memory 248 (FIG. 2A).

Next, a test of a UUT such as the UUT 212 is started in block 402. This test is typically a functional test, which may include applying test stimuli to the UUT 212 and observing responses generated by the UUT 212. For example, the relay 318 (FIG. 3) in the channel 304 may be closed and the function generator 322 controlled to apply a sine wave through the output buffer 318 to an external node of the UUT 212. Response signals may then be measured by the shared input buffer in the channel 206, which applies these signals to corresponding measurement circuits such as the DMM, the timer/counter, and the peak detector, and to the triggering circuitry. The triggering circuitry in the channel 206 may also send triggers to the corresponding measurement circuits. The triggers may coincide with edges of the measured response signals. The corresponding measurement circuits may then perform measurements of the response signals at times dictated by the triggers.

While this test is taking place, the digitizers in the channels 204 and 206 are continuously sampling all of the signals and/or levels that appear on respective lines 230 and storing the samples in the memory 248. The stored samples include samples of the sine wave applied to the UUT 212 by the function generator in the channel 204. Further, the stored samples include samples of the response signals measured by the input buffer in the channel 206.

In the preferred embodiment, the digitizers also store in the memory 248 indications of specific events occurring during the test. These indications are commonly known as "markers." For example, the digitizer 326 (FIG. 3) is coupled to the line 232, which carries triggers produced by the triggering circuitry 328. Because the digitizer 326 can detect when a trigger occurs, it can store a marker in the memory 248 indicating the sample that was acquired at the time the trigger was asserted. This is possible because of the synchronous operation of the triggering circuitry 328 and the digitizer 326.

Further, because the digitizer 326 is also coupled to the control buss 214, it can detect when drive or measurement functions start and finish and can therefore store markers in the memory 248 for these events.

As described above, a functional test also typically includes the step of determining whether observed responses are acceptable for a properly functioning UUT. This step is executed in decision block 404 shown in FIG. 4. In particular, the host computer 202 might compare a signal parameter measured by one of the measurement circuits with an expected parameter value. If the comparison shows that the UUT 212 is functioning properly, then the test method loops back to block 402 to start another test.

However, if the comparison shows that the UUT 212 is not functioning properly, then the test method branches to block 406, in which the host computer 202 uploads the samples stored in the memory 248. In the preferred embodiment, the uploaded samples include those samples that were acquired before, during and after the test started in block 402. Further, the uploaded samples preferably include the stored markers.

The uploaded samples and markers are then analyzed in block 408 to determine why the UUT was found to be functioning improperly in block 404. This may include displaying the samples in some useful format on a monitor (not shown) coupled to the host computer 202. The samples may therefore be used to reconstruct the test stimuli provided by the function generator 322 and the responses produced by the UUT 212. Further, the markers may be used to determine when triggers occurred and when the measurement circuits performed measurement functions.

It is expected that this test method will be used to debug a unit under test. Because the digitizers are continuously collecting data samples during a test involving the channels 204 and 206, a complete picture of the activity in the channels can be obtained. This data can be analyzed later if the test indicates that the unit under test is defective.

Figure 4:
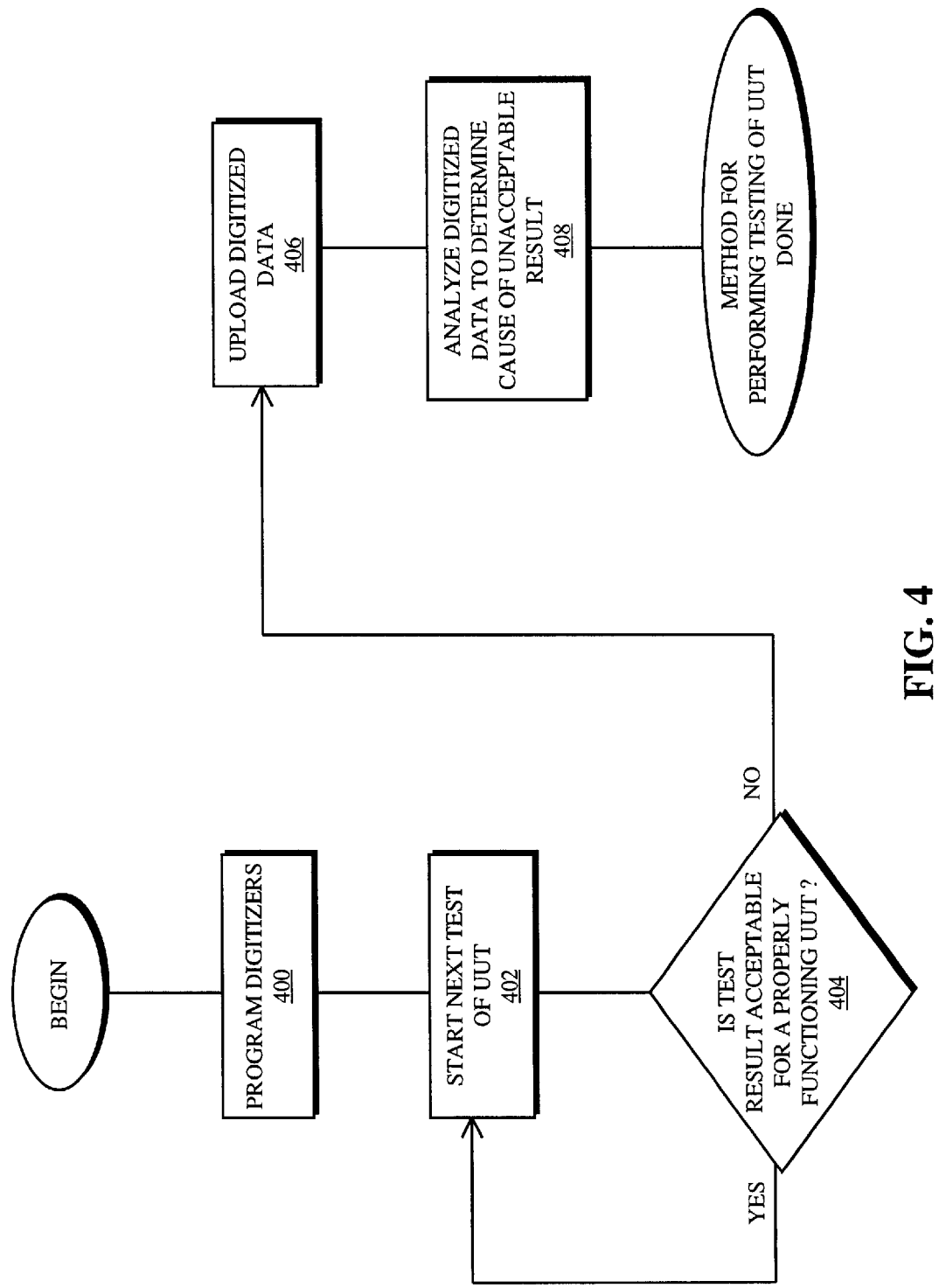
FIG. 4 is a flowchart representation of a test method in accordance with the present invention; and, FIG. 5 is a flowchart representation of another test method in accordance with the present invention.

Because the channels in the architecture 200 are preferably identical, the method shown in FIG. 4 can be performed simultaneously by all of the channels in the analog test instrument. In particular, each channel includes a digitizer that can sample signals and/or levels provided at respective input buffers. Further, each digitizer can store the samples and related markers in selected regions of the shared memory 248. Complete pictures of the activity on all of the channels in the analog test instrument may therefore be obtained and used to debug a test.

In addition, the channels in the architecture 200 preferably operate synchronously with the master clock reference 244. Further, each channel is coupled to the trigger buss 216 and the control buss 214. Consequently, the timing relationships between the test stimuli, the responses, the control signals, and the triggers are known for all of the channels. The activity on all of the channels in the architecture 200 can therefore be accurately correlated during debugging.

This is especially useful when the host computer 202 is programmed with analog diagnostic software, which typically requires data on many nodes of a unit under test to determine why a test failed. The analog diagnostic software can simply access and subsequently analyze the data samples and markers stored in the shared memory 248 that correspond to the channels involved in the test. Because the digitizers in each channel can be made to run continuously during a test, these data samples and markers are available in memory if they are needed to debug the test. Most significantly, they are available in memory without having to re-run the test.

Figure 5:
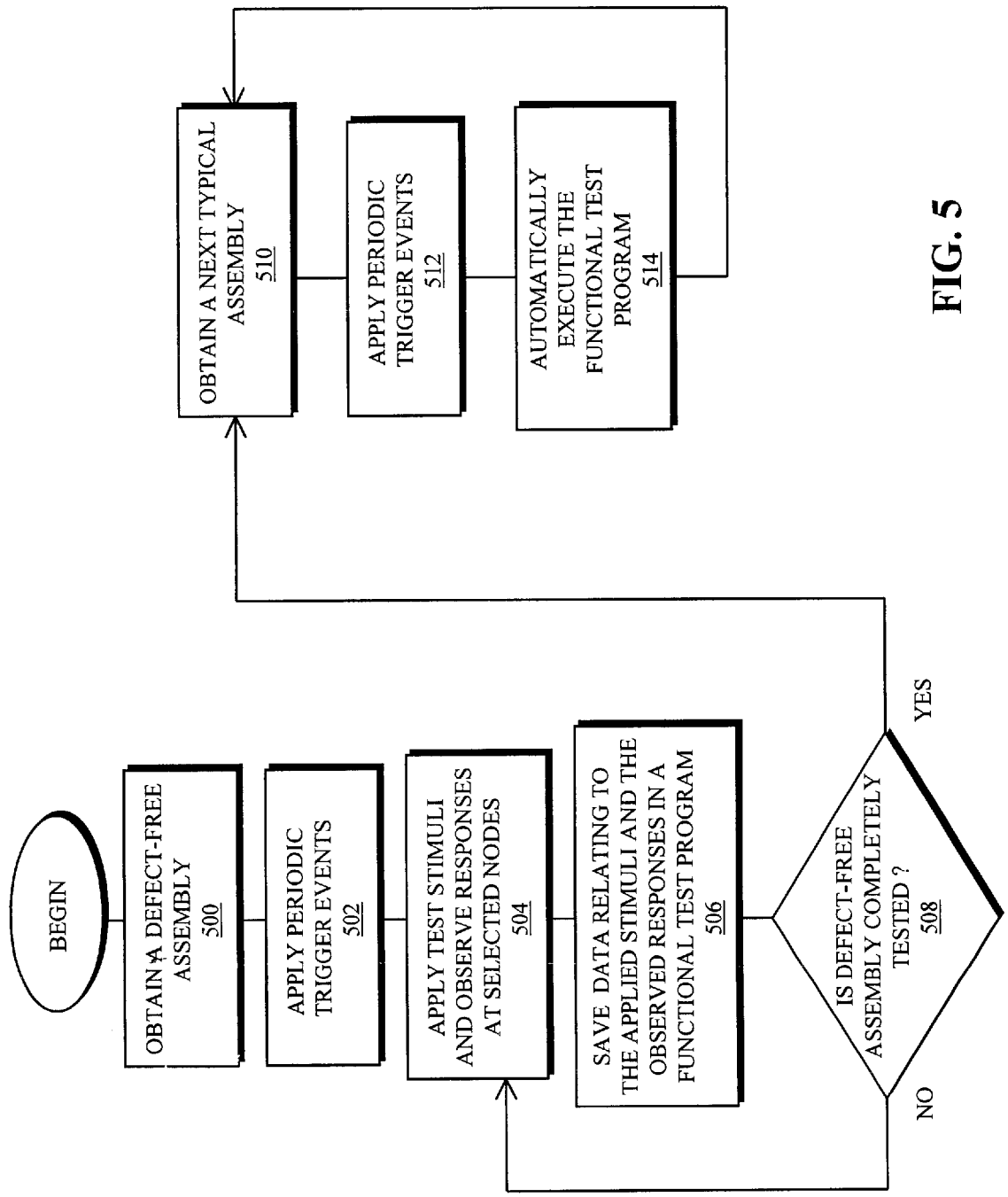

Another new testing method is shown in FIG. 5. This test method is also meant to be performed under control of software programmed into the host computer 202.

First, a known defect-free circuit assembly is obtained in block 500. Because the analog test instrument is primarily used for performing functional testing, external nodes of the known defect-free assembly are connected to channels of the analog test instrument. However, it should be noted that the channels might also be connected to internal nodes of the defect-free assembly.

Next, periodic trigger events are applied to the channels of the analog test instrument in block 502. As described above, trigger events provided by triggering circuitry included in each channel are shared by driver and measurement circuits in the channel via a line such as the line 232 (FIG. 2B). Further, the channels included in the analog test instrument are connected to a trigger buss such as the buss 216, which distributes trigger events between the channels.

Accordingly, the host computer 202 preferably controls the triggering circuitry in one of the channels, such as the channel 204, for periodically providing trigger events to driver and measurement circuits in that channel and other channels in the test instrument. More specifically, the host computer 202 controls the triggering circuitry in one of the channels to provide periodic trigger events to driver and measurement circuits in those channels that are connected to nodes of the defect-free circuit assembly. It should be noted that the specific rates at which the trigger events are applied to the channels are not critical to the invention.

Test stimuli are then applied and responses are observed at selected nodes of the defect-free assembly in block 504. Further, the test stimuli are applied and the responses are observed at times dictated by the periodic trigger events.

A goal of this step in the test method is to manually generate a functional test program for the defect-free assembly. To this end, the test engineer may repeatedly program the host computer 202 to control function generators and measurement circuits in one or more channels, thereby applying test stimuli and observing responses produced by the defect-free assembly. The test stimuli are applied and responses observed in order to test at least a portion of the defect-free assembly. In this way, the analog test instrument can "learn" how a properly functioning assembly operates.

Next, data relating to the applied test stimuli and the observed responses are saved in a functional test program in block 506. This data may be saved in a memory (not shown) included in the host computer 202. In this way, the functional test program for the defect-free assembly is manually generated in a step-wise fashion.

If the defect-free assembly has not yet been completely tested, then decision block 508 causes the test method to loop back to block 504, thereby causing the analog test instrument to apply a new set of stimuli and observe new responses. However, if the defect-free assembly has been completely tested and the functional test program is complete, then decision block 508 causes the test method to branch to block 510.

Blocks 500 through 508 of the test method are primarily meant to be performed during initial programming of the analog test instrument. Blocks 500 through 508 of this method are therefore performed relatively infrequently. However, blocks 510 through 514 are meant to be performed repeatedly in a manufacturing process for quickly and automatically testing volume quantities of circuit board assemblies.

In particular, a typical circuit assembly is obtained in block 510. This assembly is the same type as the defect-free assembly obtained in block 500. Again, external nodes of the typical circuit assembly are connected to channels of the analog test instrument.

Next, periodic trigger events are applied to the channels of the analog test instrument in block 512. These preferably correspond exactly with the periodic trigger events that are applied in block 502.

A goal of steps 510 through 514 of the test method is to automatically test circuit assemblies using the functional test program that was manually generated in steps 500 through 508. For this reason, the driver and measurement circuits that are controlled to act upon the periodic trigger events applied in block 512 are those that are needed to execute the functional test program.

The functional test program is then automatically executed in block 514. To this end, test stimuli are applied and responses observed at various external nodes of the typical circuit assembly. However, instead of repeatedly programming the host computer 202 to control the driver and measurement circuits as in step 504, the host computer 202 automatically updates and activates the driver and measurement circuits in accordance with the functional test program It is expected that the host computer 202 would also periodically query the registers 260, 262, and 263 (FIG. 2B) to determine the status of the driver and measurement circuits during the execution of the functional test program.

Further, it is expected that having the periodic trigger events applied in block 512 exactly correspond with the trigger events applied in block 502 will also aid the test engineer in achieving absolute correlation between measurements made in blocks 504 and 514. It is also expected that this use of periodic trigger events will make such measurements more repeatable.

When the typical circuit assembly is completely tested, the test method then loops back to block 510 to test another circuit assembly. The synchronous design and shared triggering of the analog test instrument therefore allow manually generated functional test programs to be executed automatically and repeatedly. Such features and capabilities are not found in conventional analog test instruments.

Having described one embodiment, numerous alternative embodiments or variations might be made. For example, it was described that the analog test instrument is primarily meant to be used for performing functional testing on electronic circuit assemblies. However, this was merely an illustration. An analog test instrument according to the invention may also be used for performing other types of tests including in-circuit testing, wherein each component on an assembly is tested individually. In this case, the analog test instrument may not only be connected to external nodes of a unit under test, but it may also be connected to different sets of internal nodes for each individual test.

In addition, it was described that the channels in the analog test instrument are preferably identical. However, this was also merely an illustration. The channels need not be identical so long as they each include triggering circuitry and a plurality of driver and measurement circuits for performing functions that are useful in testing a circuit assembly.

In addition, it was described that the channels are connected to a shared memory. However, the channels might also incorporate respective memories along with the shared memory for storing digitized data and data for generating waveforms.

In addition, specific embodiments of the driver and measurement circuits included in the analog test instrument were also described. For example, a specific embodiment of the driver circuitry is a function generator; and, specific embodiments of the measurement circuits are a multi-meter, digitizer, timer/counter, and peak detector. However, it should be understood that the driver and measurement circuits are not limited to these specific embodiments. The driver and measurement circuits might perform other functions that are useful in testing electronic circuit assemblies.

In addition, it was described that the analog test instrument may be implemented using a standard interface such as HP-IB (IEEE-488) or VXIbus (IEEE-1155). However, this was also merely an illustration. The analog test instrument may alternatively be implemented using other standard interfaces or non-standard interfaces.

In addition, it was described that each channel includes one driver circuit and a plurality of measurement circuits. However, this too was merely an illustration. The channels may alternatively include a plurality of driver circuits and just one measurement circuit; a plurality of driver circuits and a plurality of measurement circuits; or whatever number of driver and measurement circuits are most useful for testing electronic circuit assemblies.

Therefore, the invention should be limited only by the spirit and scope of the appended claims.

What is claimed is:

1. An apparatus for testing an electronic Unit Under Test (UUT) in an automatic test system, comprising:
    a trigger bus; and
    a plurality of channels, coupled to the trigger bus, for sourcing and measuring electrical signals at nodes of the UUT, each of the plurality of channels including
        an input for receiving an input signal from a node of the UUT,
        an output for providing an output signal to a node of the UUT,
        at least one measurement circuit coupled to the input,
        at least one driver circuit coupled to the output, and
        a trigger circuit coupled to the input, for generating trigger signals in response to predetermined events at the input,
        wherein the at least one measurement circuit is constructed and arranged to operate in response to the trigger signals from the trigger circuit and trigger signals from others of the plurality of channels conveyed via the trigger bus, and
        wherein different ones of the plurality of channels are configurable to operate at substantially the same time in response to trigger signals originating from any one of the plurality of channels.

2. An apparatus as recited in claim 1, wherein the at least one driver circuit is constructed and arranged to operate in response to the trigger signals from the trigger circuit and trigger signals from others of the plurality of channels conveyed via the trigger bus.

3. An apparatus as recited in claim 1, wherein the at least one measurement circuit comprises different instruments for measuring different characteristics of the input signal.

4. An apparatus as recited in claim 1, wherein the trigger circuit is coupled to a reference clock for generating the trigger signals in synchronization with the reference clock.

5. An apparatus as recited in claim 4, further comprising an input synchronization circuit disposed between the input and the plurality of measurement instruments, for sampling the input signal in synchronization with the reference clock.

6. An apparatus as recited in claim 5, further comprising:
    a control bus for conveying control signals between the plurality of channels and a host computer; and
    a control synchronization circuit coupled to the control bus, for synchronizing the passage of control signals between the host computer and the plurality of channels with the reference clock.

7. An apparatus as recited in claim 1, further comprising:
    a control bus for conveying control signals between the plurality of channels and a host computer; and
    a control synchronization circuit coupled to the control bus, for synchronizing the passage of control signals between the host computer and the plurality of channels with a reference clock.

8. An apparatus as recited in claim 7, further comprising a memory to which the at least one measurement circuit and the at least one driver circuit can write and from which they can read.

9. An apparatus as recited in claim 8, wherein the memory is coupled to control bus and control synchronization circuit, for receiving commands in synchronization with reference clock.

10. An apparatus as recited in claim 7, wherein each channel includes at least one status register readable by the host computer.

11. An apparatus as recited in claim 10, wherein the status register is constructed and arranged to store status information indicative of at least one of the following states:
    a measurement circuit waiting for a trigger;
    a driver circuit waiting for a trigger;
    a measurement circuit making a measurement; and
    a driver circuit generating an output signal.

12. An apparatus as recited in claim 1, wherein each of the plurality of channels further comprises a switch coupled between the input and the output, for selectively coupling the input to the output.

13. An apparatus as recited in claim 1, wherein the trigger circuitry of each channel is coupled to a control bus, and the trigger circuitry is constructed and arranged to generate trigger signals in response to commands conveyed on the control bus from a host computer.

14. An apparatus as recited in claim 13, wherein the trigger signals are periodically generated trigger signals.

15. An apparatus for testing an electronic Unit Under Test (UUT) in an automatic test system, comprising:
    a trigger bus; and
    a plurality of channels, coupled to the trigger bus, for measuring electrical signals at nodes of the UUT, each of the plurality of channels including
        an input for receiving an input signal from a node of the UUT,
        an output for providing an output signal to a node of the UUT, means for measuring the input signal, means for sourcing the output signal, and trigger means, coupled to the input, for generating trigger signals in response to predetermined events at the input, wherein the means for measuring is operable in response to trigger signals from the trigger means and trigger signals from others of the plurality of channels conveyed via the trigger bus, and wherein different ones of the plurality of channels are configurable to operate at substantially the same time in response to trigger signals originating from any one of the plurality of channels.

16. An apparatus as recited in claim 15, wherein the means for sourcing is operable in response to trigger signals from the trigger means and trigger signals from others of the plurality of channels conveyed via the trigger bus.

17. An apparatus as recited in claim 15, wherein the means for measuring comprises different instruments that measure different characteristics of the input signal.

18. An apparatus as recited in claim 15, wherein the trigger means is coupled to a reference clock for generating the trigger signals in synchronization with the reference clock.

19. An apparatus as recited in claim 15, further comprising input means for sampling the input signal in synchronization with the reference clock.

20. A method of testing a circuit in an automatic test system that includes a plurality of channels for exercising different nodes of the circuit, comprising:

(A) sourcing a respective output signal from at least one of the plurality of channels;

(B) sampling a respective input signal by at least one of the plurality of channels; and (C) generating a plurality of trigger signals for activating the sourcing and sampling steps, wherein the plurality of trigger signals is generated by any of a variety of events, including respective predetermined events occurring at the input signals of the respective channels, and wherein the plurality of trigger signals is conveyed to each of the plurality of channels for simultaneously activating sourcing and sampling actions among different ones of the plurality of channels.

21. A method as recited in step 20, further comprising:

(D) measuring a plurality of analog characteristics of each input signal received in Step B, in response to the trigger signals generated in Step C.

22. A method as recited in claim 20, wherein the variety of events further includes a predetermined event occurring on the input signal one of the plurality of channels other than the respective channel.

23. A method as recited in claim 20, wherein the variety of events further includes a triggering command issued by a host computer.

24. A method as recited in claim 23, further comprising a step of issuing repetitive triggering commands from the host computer to generate periodic trigger events.

25. A method as recited in claim 20, further comprising:

starting one of a sourcing and sampling step in response to trigger signals generated by one of the plurality of channels; and stopping said one of the sourcing and sampling step in response to trigger signals generated by another of the plurality of channels.

* * * * *